(12) United States Patent
Choi

(10) Patent No.: US 11,894,076 B2
(45) Date of Patent: Feb. 6, 2024

(54) APPARATUS AND METHOD FOR PROGRAMMING AND VERIFYING DATA IN NON-VOLATILE MEMORY DEVICE

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 191 days.

(21) Appl. No.: 17/583,913

(22) Filed: Jan. 25, 2022

(65) Prior Publication Data

US 2023/0088147 A1  Mar. 23, 2023

(30) Foreign Application Priority Data

Sep. 17, 2021 (KR) ................. 10-2021-0124804

(51) Int. Cl.
| | | |
|---|---|---|
| *G11C 16/34* | (2006.01) | |
| *G11C 16/08* | (2006.01) | |
| *G11C 7/10* | (2006.01) | |
| *G11C 16/24* | (2006.01) | |
| *G11C 16/10* | (2006.01) | |
| *G11C 16/26* | (2006.01) | |

(52) U.S. Cl.
CPC ........ *G11C 16/3459* (2013.01); *G11C 7/1039* (2013.01); *G11C 16/08* (2013.01); *G11C 16/102* (2013.01); *G11C 16/24* (2013.01); *G11C 16/26* (2013.01); *G11C 16/3404* (2013.01)

(58) Field of Classification Search
CPC ...................................... G11C 16/08
See application file for complete search history.

(56) References Cited

U.S. PATENT DOCUMENTS

| 2009/0073771 A1* | 3/2009 | Li .................. G11C 16/3454 |
| | | 365/185.22 |
| 2011/0157997 A1* | 6/2011 | Kamigaichi ........ G11C 11/5628 |
| | | 365/185.22 |
| 2011/0273935 A1* | 11/2011 | Dong ................. G11C 11/5642 |
| | | 365/185.25 |
| 2013/0155769 A1* | 6/2013 | Li ..................... G11C 16/0483 |
| | | 365/185.03 |
| 2022/0328114 A1* | 10/2022 | Chai .................. G11C 11/5642 |

FOREIGN PATENT DOCUMENTS

| KR | 10-1074564 B1 | 10/2011 |
| KR | 10-1807756 B1 | 12/2017 |

\* cited by examiner

*Primary Examiner* — Douglas King
(74) *Attorney, Agent, or Firm* — IP & T GROUP LLP

(57) ABSTRACT

An operating method of a non-volatile memory device comprises: performing a foggy operation applying a first application voltage to a word line and applying a first verification voltage having a same level as or a higher level than a target threshold voltage to the word line, determining whether the foggy operation is completely performed according to whether a number of memory cells each having a threshold voltage higher than the first verification voltage is equal to or greater than a first number, performing a fine operation applying a second application voltage to the word line and applying a second verification voltage having the same level as the target threshold voltage, and determining whether the fine operation is completely performed, according to whether a number of memory cells each having a threshold voltage lower than the second verification voltage is less than or equal to a second number.

13 Claims, 11 Drawing Sheets

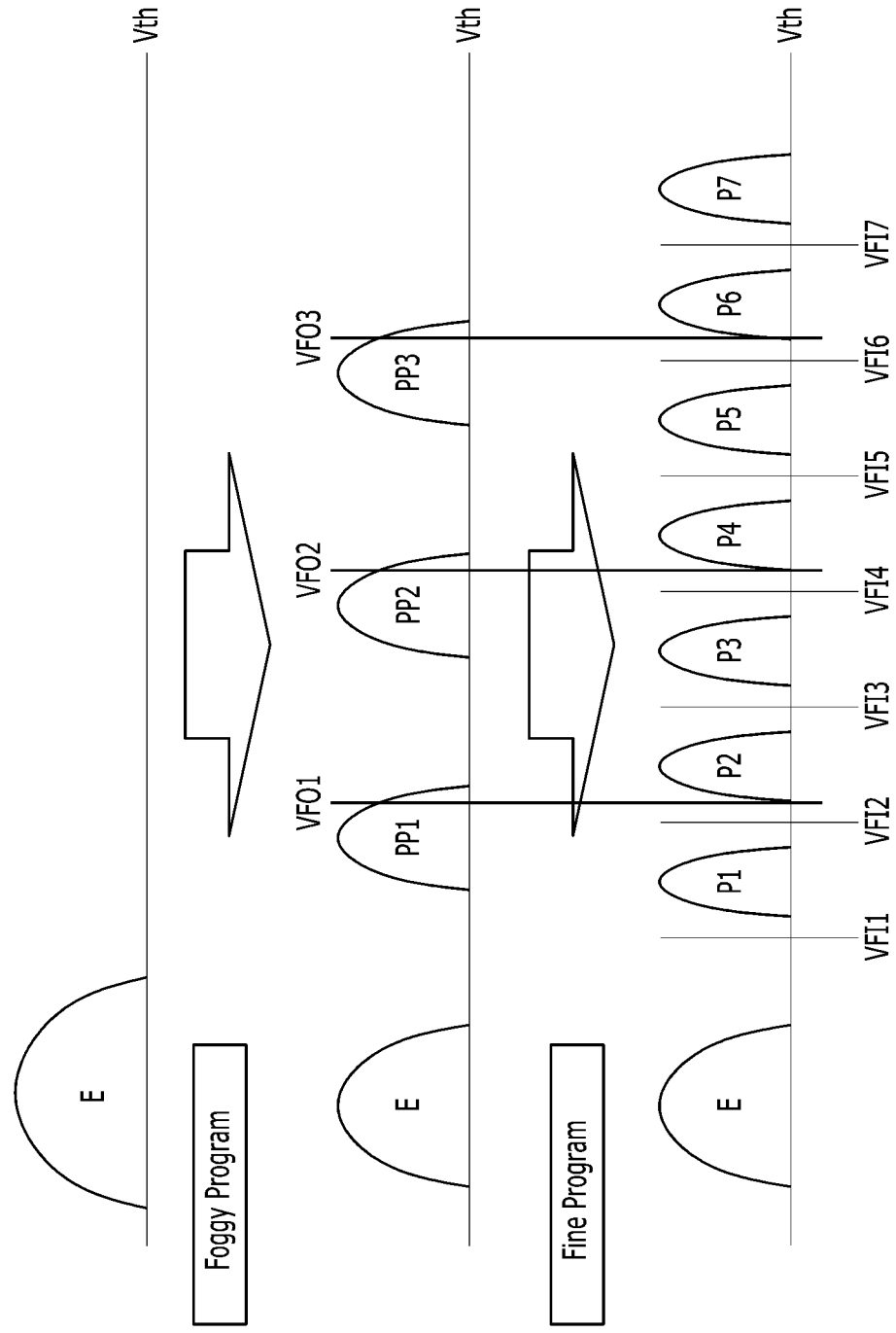

APPARATUS AND METHOD FOR PROGRAMMING AND VERIFYING DATA IN NON-VOLATILE MEMORY DEVICE

CROSS-REFERENCE TO RELATED APPLICATION(S)

The present application claims priority under 35 U.S.C. § 119(a) to Korean Patent Application No. 10-2021-0124804, filed on Sep. 17, 2021, the disclosure of which is incorporated herein by reference in its entirety.

BACKGROUND

1. Field

Various embodiments of the present disclosure generally relate to a memory device, and particularly, to an apparatus and a method for programming and verifying data in a non-volatile memory device.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when the power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when the power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

SUMMARY

Various embodiments of the present disclosure are directed to an apparatus that may store data in a non-volatile memory device through a program operation including two different types of application operations and two different types of verification operations.

In accordance with an embodiment of the present invention, a non-volatile memory device may include: a memory cell array including a plurality of memory cells coupled between a plurality of word lines and a plurality of bit lines; a peripheral circuit suitable for: performing a foggy operation including a first application operation of applying a first application voltage to a selected word line among the plurality of word lines and a first verification operation of applying a first verification voltage having a same level as or a higher level than a target threshold voltage to the selected word line, and performing a fine operation including a second application operation of applying a second application voltage to the selected word line and a second verification operation of applying a second verification voltage having the same level as the target threshold voltage; and a control logic circuit suitable for: determining whether the foggy operation is completely performed according to whether a number of memory cells each having a threshold voltage higher than the first verification voltage is equal to or greater than a first predetermined number as a result of the first verification operation, and determining whether the fine operation is completely performed according to whether a number of memory cells each having a threshold voltage lower than the second verification voltage is less than or equal to a second predetermined number as a result of the second verification operation.

In accordance with an embodiment of the present invention, an operating method of a non-volatile memory device, the operating method may include: performing a foggy operation including a first application operation of applying a first application voltage to a selected word line among a plurality of word lines and a first verification operation of applying a first verification voltage having a same level as or a higher level than a target threshold voltage to the selected word line; performing a first determination of determining whether the foggy operation is completely performed according to whether a number of memory cells each having a threshold voltage higher than the first verification voltage is equal to or greater than a first predetermined number as a result of the first verification operation; performing a fine operation including a second application operation of applying a second application voltage to the selected word line and a second verification operation of applying a second verification voltage having the same level as the target threshold voltage; and performing a second determination of determining whether the fine operation is completely performed, according to whether a number of memory cells each having a threshold voltage lower than the second verification voltage is less than or equal to a second predetermined number as a result of the second verification operation.

In accordance with an embodiment of the present invention, an operating method of a nonvolatile memory device including a row of cells, the operating method may include: performing a foggy program operation to the row; performing a foggy verification operation of verifying the foggy program operation by applying a foggy verification voltage, which is equal to or higher than a target threshold voltage, to the row and a foggy sensing voltage to columns of the respective cells; performing a fine program operation to the row when the foggy program operation is verified as successful; and performing a fine verification operation of verifying the fine program operation by applying a fine verification voltage, which is equal to the target threshold voltage, to the row and a fine sensing voltage, which is higher than the foggy sensing voltage, to the columns. The foggy program operation may be verified as successful when a number of the cells each having a threshold voltage higher than the foggy verification voltage is greater than a first threshold, and the fine program operation may be verified as successful when a number of the cells each having a threshold voltage lower than the foggy verification voltage is less than a second threshold.

The technical attributes obtainable from the present disclosure are not limited to those described herein, and other technical attributes not described herein will be understood by those skilled in the art, to which the present disclosure pertains, from the following description.

BRIEF DESCRIPTION OF THE DRAWINGS

FIG. 7 is a diagram illustrating an example of the program operation including a foggy operation and a fine operation, in accordance with an embodiment of the present disclosure.

DETAILED DESCRIPTION

Figure 1:
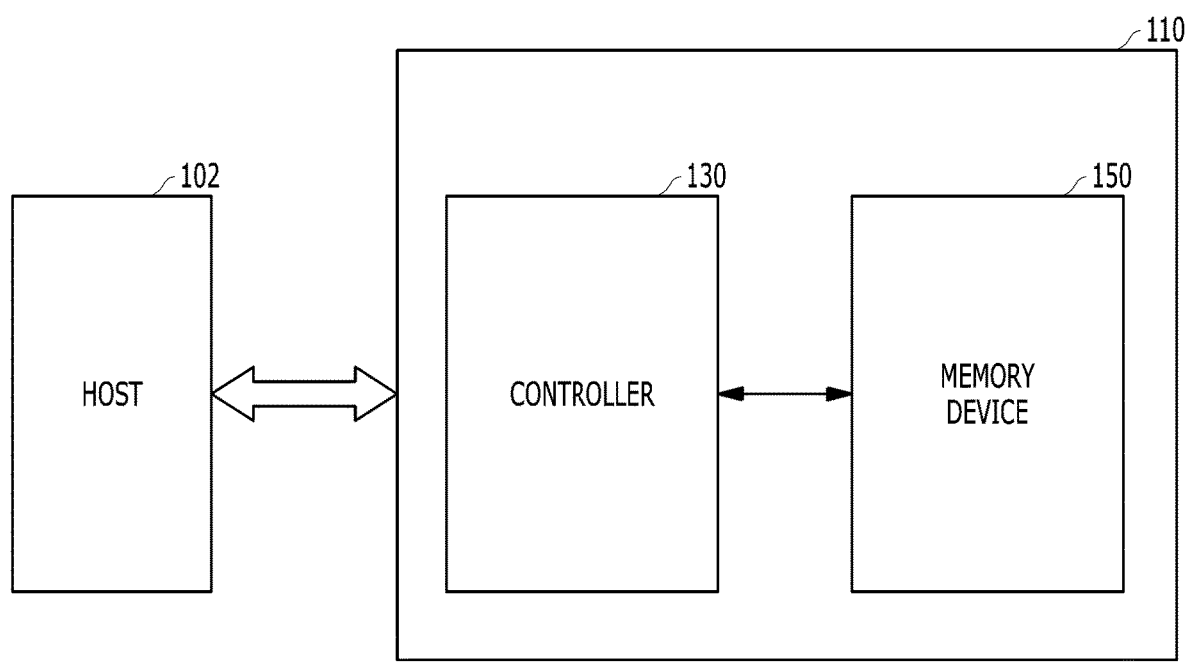
FIG. 1 is a diagram illustrating a memory system in accordance with an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/ circuits/components include structure (e.g., circuitry) that performs one or more tasks during operation. As such, the block/unit/circuit/component can be said to be configured to perform the task even when the specified block/unit/circuit/ component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram illustrating a memory system in accordance with an embodiment of the present disclosure.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The memory system 110 operates in response to a request from the host 102, and, in particular, stores data to be accessed by the host 102. The memory system 110 may be used as a main memory device or an auxiliary memory device of the host 102. The memory system 110 may be implemented as any of various types of storage devices, depending on a host interface protocol which is coupled with the host 102. For example, the memory system 110 may be implemented as any of a solid state driver (SSD), a multimedia card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a secure digital (SD) card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation.

The memory cell array may include a plurality of memory blocks. Each memory block may include a plurality of memory cells. One memory block may include a plurality of pages. In an embodiment, each page may be a unit by which data is stored in the memory device 150 or by which data stored in the memory device 150 is read.

A memory block may be a unit by which data is erased. In an embodiment, the memory device 150 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on that the memory device 150 is a NAND flash memory.

The memory device 150 may receive a command and an address from the controller 130, and may access the area of the memory cell array, selected by the address. That is, the memory device 150 may perform an operation indicated by the command on the area selected by the address. For example, the memory device 150 may perform a write operation (i.e., program operation), a read operation, and an erase operation. During a program operation, the memory device 150 may program data to the area selected by the address. During a read operation, the memory device 150 may read data from the area selected by the address. During an erase operation, the memory device 150 may erase data stored in the area selected by the address.

The controller 130 controls the overall operation of the memory system 110.

When power is applied to the memory system 110, the controller 130 may run firmware (FW). When the memory device 150 is a flash memory device, the controller 130 may run firmware such as a flash translation layer (FTL) for controlling communication between the host 102 and the memory device 150.

In an embodiment, the controller 130 may receive data and a logical block address (LBA) from the host 102, and may translate the logical block address into a physical block address (PBA) indicating the address of memory cells which are included in the memory device 150 and in which data is to be stored. In this specification, a logical block address (LBA) and a logical address may be used in the same sense. In this specification, a physical block address (PBA) and a physical address may be used in the same sense.

The controller 130 may control the memory device 150 so that a program operation, a read operation, or an erase operation is performed in response to a request received from the host 102. During a program operation, the controller 130 may provide a program command, a physical block address, and data to the memory device 150.

During a read operation, the controller 130 may provide a read command and a physical block address to the memory device 150. During an erase operation, the controller 130 may provide an erase command and a physical block address to the memory device 150.

In an embodiment, the controller 130 may autonomously generate a command, an address, and data regardless of a request from the host 102, and may transmit the command, the address, and the data to the memory device 150. For example, the controller 130 may provide commands, addresses, and data to the memory device 150 to perform background operations, such as a program operation for wear leveling and a program operation for garbage collection.

In an embodiment, the controller 130 may control two or more memory devices 100. In such case, the controller 130 may control the memory devices 100 depending on an interleaving scheme to improve operating performance. The interleaving scheme may be an operating manner in which the operating periods of the at least two memory devices 100 are caused to overlap each other.

The host 102 may communicate with the memory system 110 using at least one of various communication standards or interfaces such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
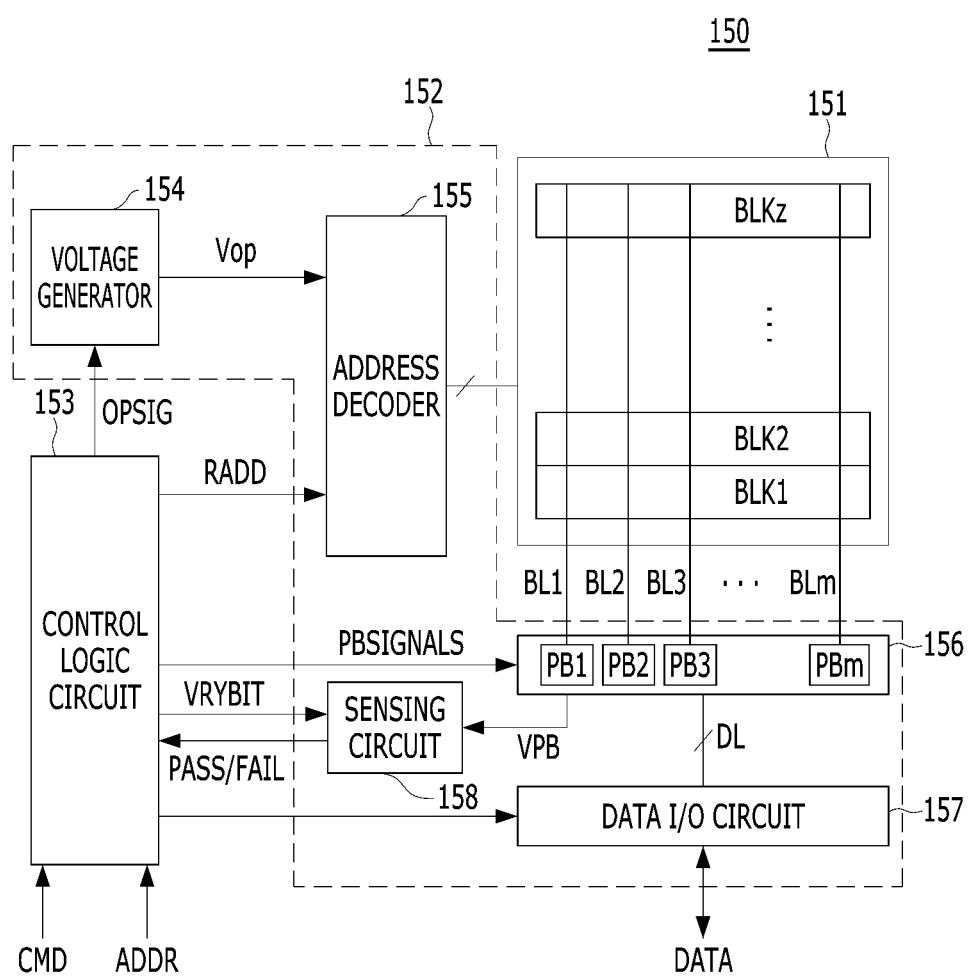
FIG. 2 is a detailed diagram illustrating a memory device illustrated in FIG. 1, in accordance with an embodiment of the present disclosure.

FIG. 2 is a detailed diagram illustrating a memory device illustrated in FIG. 1 in accordance with an embodiment of the present disclosure.

Referring to FIG. 2, the memory device 150 may include a memory cell array 151, a peripheral circuit 152 and a control logic circuit 153.

The memory cell array 151 may include a plurality of memory blocks BLK1 to BLKz. The plurality of memory blocks BLK1 to BLKz may be connected to an address decoder 155 through a row line RL. The plurality of memory blocks BLK1 to BLKz may be connected to a page buffer group 156 through bit lines BL1 to BLm. Each of the memory blocks BLK1 to BLKz may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

The memory cells included in the memory cell array 151 may be configured as single level cells (SLCs) each storing 1-bit data, multi-level cells (MLCs) each storing 2-bit data, triple level cells (TLCs) each storing 3-bit data or quad level cells (QLCs) each storing 4-bit data.

The peripheral circuit 152 may be configured to perform a program, read or erase operation on a selected region of the memory cell array 151. The peripheral circuit 152 may drive the memory cell array 151. For example, the peripheral circuit 152 may apply various operating voltages to the row line RL and the bit lines BL1 to BLm, or discharge the applied voltages.

The peripheral circuit 152 may include the address decoder 155, a voltage generator 154, the page buffer group 156, a data input/output circuit 157 and a sensing circuit 158.

The peripheral circuit 152 may drive the memory cell array 151. For example, the peripheral circuit 152 may drive the memory cell array 151 to perform the program, read and erase operations.

The address decoder 155 may be connected to the memory cell array 151 through the row line RL. The row line RL may include the drain selection line, the word lines, the source selection line and a common source line.

The address decoder 155 may be configured to operate in response to the control of the control logic circuit 153. The address decoder 155 may receive an address RADD from the control logic circuit 153.

The address decoder 155 may be configured to decode a block address of the received address RADD. The address decoder 155 may select at least one memory block among the memory blocks BLK1 to BLKz according to the decoded block address. The address decoder 155 may be configured to decode a row address of the received address RADD. The address decoder 155 may select at least one word line among word lines of the selected memory block according to the decoded row address. The address decoder 155 may apply operating voltages Vop, which are supplied from the voltage generator 154, to the selected word line.

During the program operation, the address decoder 155 may apply a program voltage to the selected word line, and apply a pass voltage lower than the program voltage to an unselected word line. During a program verification operation, the address decoder 155 may apply a verification voltage to the selected word line, and apply a verification pass voltage higher than the verification voltage to the unselected word line.

During the read operation, the address decoder 155 may apply a read voltage to the selected word line, and apply a read pass voltage higher than the read voltage to the unselected word line.

The erase operation of the memory device 150 may be performed in units of memory blocks. An address ADDR inputted to the memory device 150 during the erase operation may include a block address. The address decoder 155 may decode the block address, and select at least one memory block according to the decoded block address.

During the erase operation, the address decoder 155 may apply a ground voltage to a word line of the selected memory block.

The voltage generator 154 may be configured to generate a plurality of operating voltages Vop by using an external power supply voltage supplied to the memory device 150. The voltage generator 154 may operate in response to the control of the control logic circuit 153.

In an embodiment, the voltage generator 154 may regulate the external power supply voltage, and generate an internal power supply voltage. The internal power supply voltage generated by the voltage generator 154 may be used as an operating voltage of the memory device 150.

In an embodiment, the voltage generator 154 may generate the plurality of operating voltages Vop by using the external power supply voltage or the internal power supply voltage. The voltage generator 154 may be configured to generate various voltages required by the memory device 150. For example, the voltage generator 154 may generate a plurality of erase voltages, a plurality of program voltages, a plurality of pass voltages, a plurality of selective read voltages and a plurality of unselective read voltages.

The voltage generator 154 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic circuit 153.

The generated operating voltages Vop may be supplied to the memory cell array 151 by the address decoder 155.

The page buffer group 156 may include a plurality of page buffers PB1 to PBm. The plurality of page buffers PB1 to PBm may be connected to the memory cell array 151 through the plurality of bit lines BL1 to BLm, respectively. The plurality of page buffers PB1 to PBm may operate in response to the control of the control logic circuit 153.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

During the program operation, the plurality of page buffers PB1 to PBm may transmit the data DATA, which is received through the data input/output circuit 157, to the selected memory cell through the bit lines BL1 to BLm when the program voltage is applied to the selected word line. Memory cells of a selected page may be programmed according to the transmitted data DATA. A memory cell connected to a bit line to which a program allowable voltage, for example, a ground voltage, is applied may have a raised threshold voltage. A threshold voltage of a memory cell connected to a bit line to which a program inhibited voltage, for example, a power supply voltage, is applied may be maintained. During the program verification operation, the plurality of page buffers PB1 to PBm may read the data DATA, which is stored in the memory cell, from the selected memory cell through the bit lines BL1 to BLm.

During the read operation, the page buffer group 156 may read the data DATA from the memory cell of the selected page through the bit lines BLs, and store the read data DATA in the plurality of page buffers PB1 to PBm.

During the erase operation, the page buffer group 156 may float the bit lines BLs. In an embodiment, the page buffer group 156 may include a column selection circuit.

The data input/output circuit 157 may be connected to the plurality of page buffers PB1 to PBm through the data line DL. The data input/output circuit 157 may operate in response to the control of the control logic circuit 153.

The data input/output circuit 157 may include a plurality of input/output buffers (not illustrated) that receive the data DATA inputted thereto. During the program operation, the data input/output circuit 157 may receive the data DATA to be stored from the controller 130 (refer to FIG. 1). The data input/output circuit 157 may output the data DATA, which is transmitted from the plurality of page buffers PB1 to PBm included in the page buffer group 156, to the controller 130 (refer to FIG. 1) during the read operation.

During the read operation or the verification operation, the sensing circuit 158 may generate a reference current in response to an allowable bit VRYBIT generated by the control logic circuit 153, and output a pass signal PASS or a fail signal FAIL to the control logic circuit 153 by comparing a sensing voltage VPB received from the page buffer group 156 with a reference voltage attributable to the reference current.

The control logic circuit 153 may be connected to the address decoder 155, the voltage generator 154, the page buffer group 156, the data input/output circuit 157 and the sensing circuit 158. The control logic circuit 153 may be configured to control overall operations of the memory device 150. The control logic circuit 153 may operate in response to a command CMD transmitted from an external device.

The control logic circuit 153 may generate various signals in response to the command CMD and the address ADDR, and control the other components 154 to 158 included in the peripheral circuit 152. For example, the control logic circuit 153 may generate an operation signal OPSIG, the address RADD, read and write circuit control signals PBSIGNALS and the allowable bit VRYBIT in response to the command CMD and the address ADDR. The control logic circuit 153 may output the operation signal OPSIG to the voltage generator 154, output the address RADD to the address decoder 155, output the read and write control signals PBSIGNALS to the page buffer group 156, and output the allowable bit VRYBIT to the sensing circuit 158. In addition, the control logic circuit 153 may determine whether the verification operation has passed or failed, in response to the pass or fail signal PASS or FAIL outputted by the sensing circuit 158.

Figure 3:
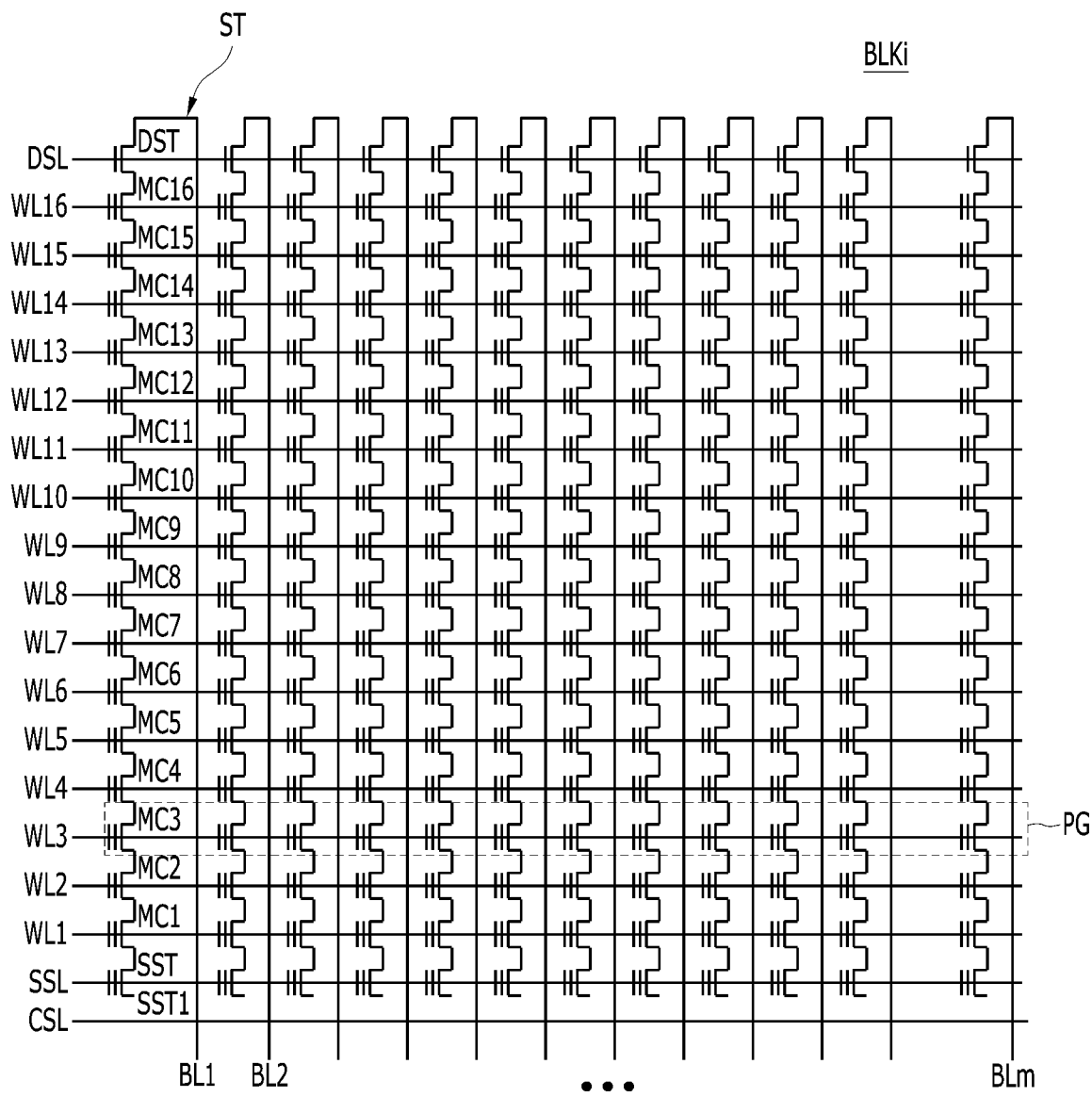
FIG. 3 is a detailed diagram illustrating a memory block illustrated in FIG. 2, in accordance with an embodiment of the present disclosure.

FIG. 3 is a detailed diagram illustrating a memory block illustrated in FIG. 2 in accordance with an embodiment of the present disclosure.

Referring to FIG. 3, a plurality of word lines arranged in parallel with one another may be connected between a first selection line and a second selection line. The first selection line may be a source selection line SSL, and the second selection line may be a drain selection line DSL. More specifically, a memory block BLKi may include a plurality of memory cell strings ST connected between the bit lines BL1 to BLm and a common source line CSL. The bit lines BL1 to BLm may be connected to the memory cell strings ST, respectively, and the common source line CSL may be connected to the memory cell strings ST in common. Since the memory cell strings ST may have the same configuration, the memory cell string ST connected to the first bit line BL1 is representatively described in detail.

The memory cell string ST may include a source selection transistor SST, a plurality of memory cells MC1 to MC16 and a drain selection transistor DST connected in series between the common source line CSL and the first bit line BL1. At least one drain selection transistor DST may be included in one memory cell string ST, and more source selection transistors SST and memory cells MC1 to MC16 may be included than illustrated in the drawing.

A source of the source selection transistor SST may be connected to the common source line CSL, and a drain of the drain selection transistor DST may be connected to the first bit line BL1. The memory cells MC1 to MC16 may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MC16 may be connected to a plurality of word lines WL1 to WL16, respectively. A group of memory cells connected to the same word line among memory cells included in different memory cell strings ST may be referred to as a physical page PG. Accordingly, as many physical pages PG as the number of word lines WL1 to WL16 may be included in the memory block BLKi.

One memory cell may store 1-bit data. This is commonly referred to as a single level cell (SLC). In this case, one physical page PG may store one logical page (LPG) data. One logical page (LPG) data may include as many data bits as the number of cells included in one physical page PG.

One memory cell may store two or more bits of data. In this case, one physical page PG may store two or more logical page (LPG) data.

Figure 4:
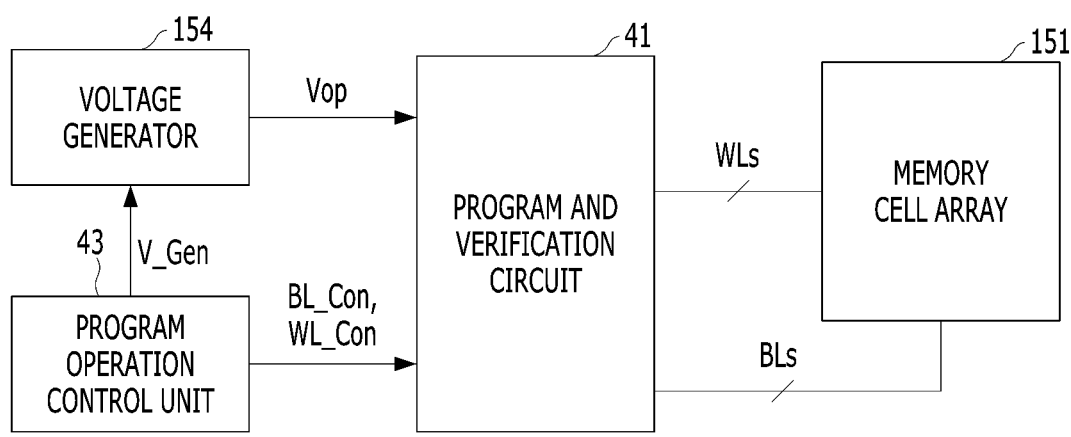
FIG. 4 is a detailed diagram illustrating the memory device illustrated in FIG. 2, in accordance with an embodiment of the present disclosure.

FIG. 4 is a detailed diagram illustrating the memory device 150 illustrated in FIG. 2, in accordance with an embodiment of the present disclosure.

Figure 5:
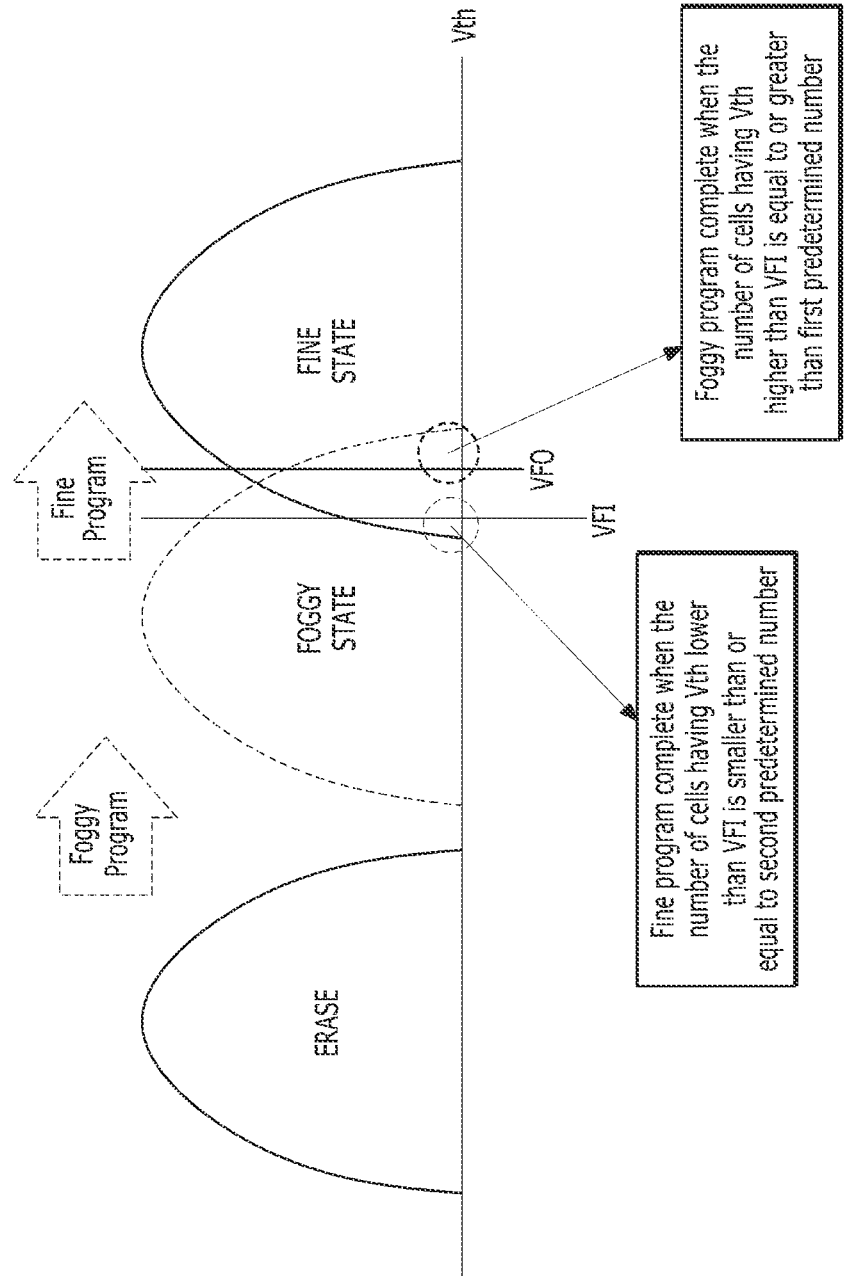
FIG. 5 is a diagram illustrating a program operation including a foggy operation and a fine operation, in accordance with an embodiment of the present disclosure.

FIG. 5 is a diagram illustrating a program operation including a foggy operation and a fine operation, in accordance with an embodiment of the present disclosure.

Figure 6A:
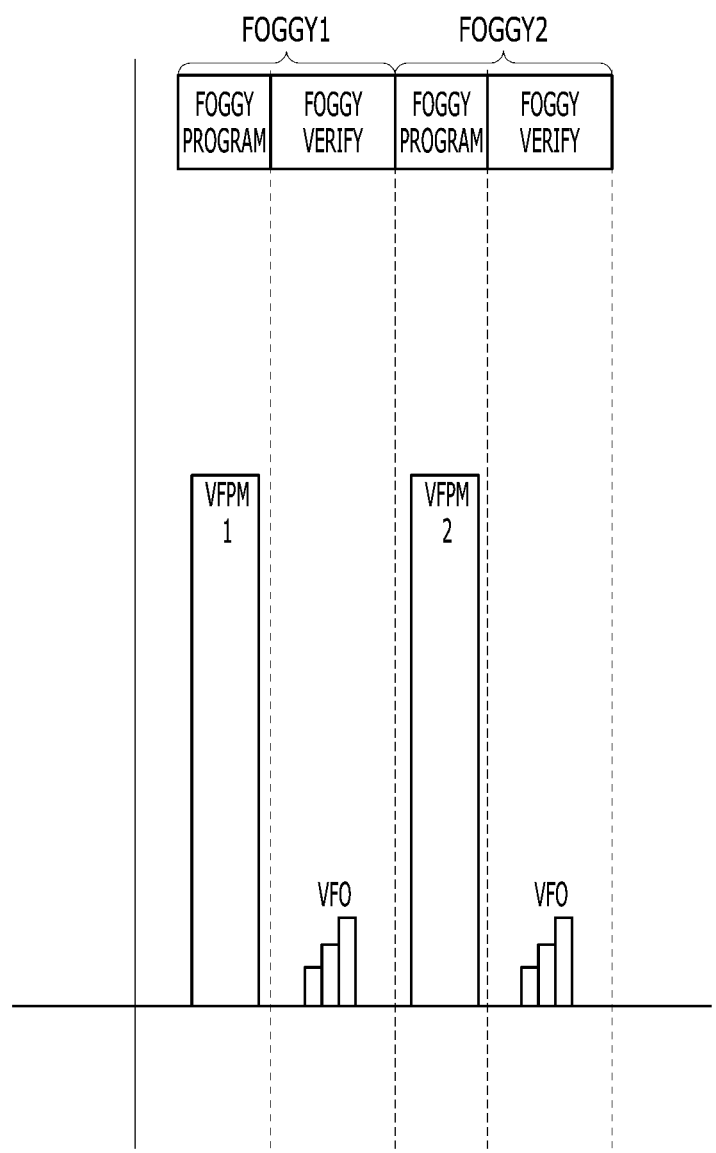
FIGS. 6A and 6B are diagrams illustrating an execution sequence of the program operation including a foggy operation and a fine operation, in accordance with an embodiment of the present disclosure.
Figure 6B:
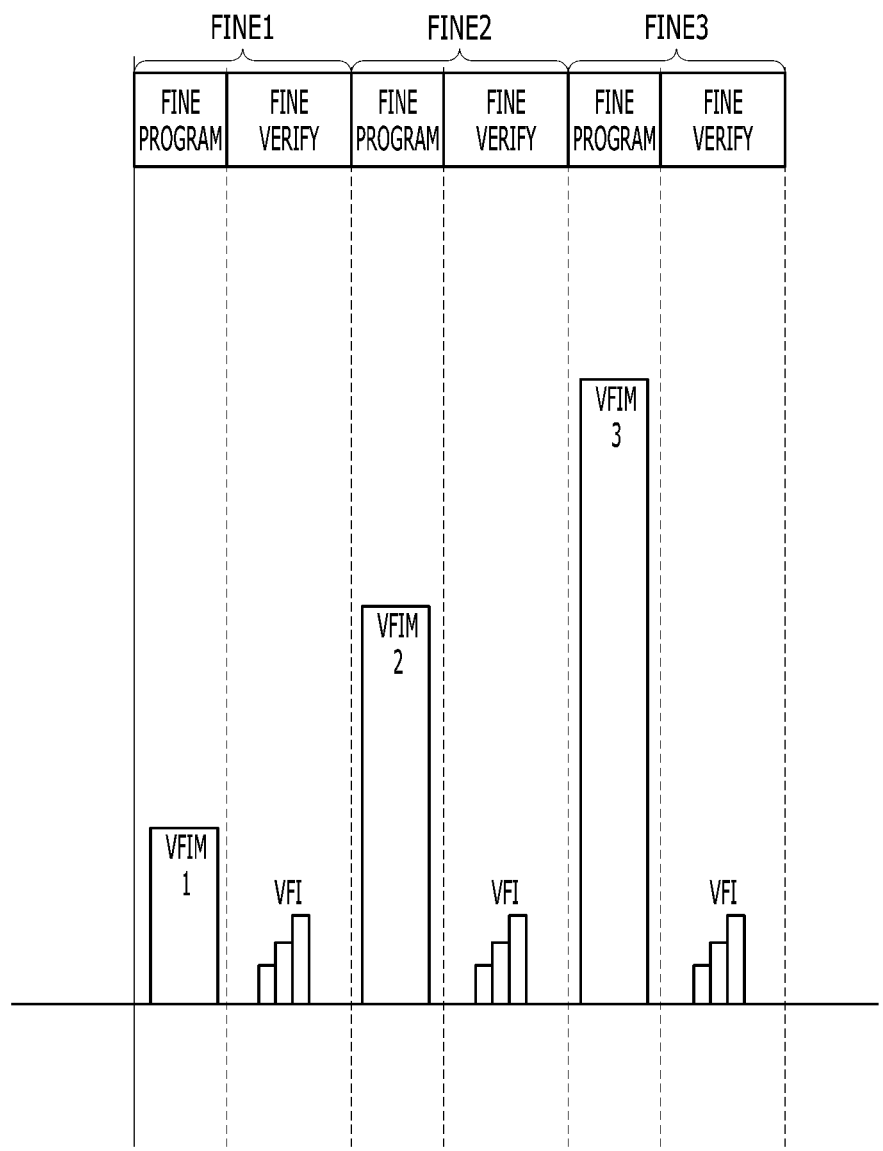

FIGS. 6A and 6B are diagrams illustrating an execution sequence of the program operation including a foggy operation and a fine operation, in accordance with an embodiment of the present disclosure.

Referring to FIG. 4, the memory device 150 may include the memory cell array 151, a program and verification circuit 41, a voltage generator 154 and a program operation control unit 43.

The peripheral circuit 152 described with reference to FIG. 2 may include the program and verification circuit 41 and the voltage generator 154. The program and verification circuit 41 may include the address decoder 155, the sensing circuit 158, the page buffer group 156 and the data input/output circuit 157 which are illustrated in FIG. 2. The control logic circuit 153 described with reference to FIG. 2 may include the program operation control unit 43. That is, an operation of the program and verification circuit 41, which is to be described below, may be an operation of the peripheral circuit 152, and an operation of the program operation control unit 43 may be an operation of the control logic circuit 153.

The memory cell array 151 may include a plurality of memory cells. The memory cell array 151 may be connected to the program and verification circuit 41 through a plurality of word lines WLs connected to the plurality of memory cells. The memory cell array 151 may be connected to the program and verify circuit 41 through a plurality of bit lines BLs connected to the plurality of memory cells. The plurality of word lines WLs and the plurality of bit lines BLs may be cross-connected as described in FIG. 3.

The voltage generator 154 may generate the operating voltages Vop, which are required for operations on the memory cells, in response to a voltage generation signal V_Gen. Among the operating voltages Vop, a voltage applied to a word line may be a word line voltage. The voltage generator 154 may provide the program and verification circuit 41 with the generated operating voltages Vop.

The program and verification circuit 41 may receive the operating voltages Vop from the voltage generator 154. The program and verification circuit 41 may perform a program operation including a foggy operation and a fine operation so that a plurality of memory cells included in a word line selected as a program target among the plurality of word lines WLs have a predetermined target threshold voltage. The foggy operation may include a first application operation and a first verification operation, and the fine operation may include a second application operation and a second verification operation. The program and verification circuit 41 may apply a first verification voltage having a level equal to or higher than the target threshold voltage for the program operation to the word line selected as the program target, during the first verification operation included in the foggy operation. The program and verification circuit 41 may apply a second verification voltage having the same level as the target threshold voltage for the program operation to the word line selected as the program target, during the second verification operation included in the fine operation.

The program operation control unit 43 may determine whether the foggy operation has been completely performed, according to whether the number of memory cells each having a threshold voltage higher than the first verification voltage among the plurality of memory cells included in the word line selected as the program target is equal to or greater than a first predetermined number during the first verification operation included in the foggy operation. The program operation control unit 43 may determine whether the fine operation has been completely performed, according to whether the number of memory cells each having a threshold voltage lower than the second verification voltage among the plurality of memory cells included in the word line selected as the program target is less than or equal to a second predetermined number during the second verification operation included in the fine operation.

The program operation control unit 43 may control the program and verification circuit 41 to repeatedly perform the foggy operation until the foggy operation is completely performed, during the first verification operation included in the foggy operation. That is, when it is confirmed that the number of memory cells each having a threshold voltage higher than the first verification voltage among the plurality of memory cells included in the word line selected as the program target is less than the first predetermined number during the first verification operation included in the foggy operation, the program operation control unit 43 may control the program and verification circuit 41 to repeatedly perform the first application operation and the first verification operation included in the foggy operation.

When it is determined that the foggy operation has been completely performed during the first verification operation included in the foggy operation, the program operation control unit 43 may control the program and verification circuit 41 to start performing the fine operation. That is, when it is confirmed that the number of memory cells each having a threshold voltage higher than the first verification voltage among the plurality of memory cells included in the word line selected as the program target is equal to or greater than the first predetermined number during the first verification operation included in the foggy operation, the program operation control unit 43 may control the program and verification circuit 41 to perform the second application operation and the second verification operation included in the fine operation.

The program operation control unit 43 may control the program and verification circuit 41 to repeatedly perform the fine operation until the fine operation is completely performed during the second verification operation included in the fine operation. That is, when it is confirmed that the number of memory cells each having a threshold voltage lower than the second verification voltage among the plurality of memory cells included in the word line selected as the program target is greater than the second predetermined number during the second verification operation included in the fine operation, the program operation control unit 43 may control the program and verification circuit 41 to repeatedly perform the second application operation and the second verification operation included in the fine operation.

When it is determined that the fine operation has been completely performed during the second verification operation included in the fine operation, the program operation control unit 43 may control the program and verification circuit 41 to terminate the program operation. That is, when it is confirmed that the number of memory cells each having a threshold voltage lower than the second verification voltage among the plurality of memory cells included in the word line selected as the program target is less than or equal to the second predetermined number during the second verification operation included in the fine operation, the program operation control unit 43 may determine that the plurality of memory cells have the target threshold voltage, and control the program and verification circuit 41 to terminate the program operation.

The foggy operation and the fine operation for one word line selected as the program target may not be continuous. According to an embodiment, the foggy operation may be performed on any word line selected as the program target, and before the fine operation is performed on the any word line, the foggy operation may be performed on another word line selected as the program target. The reason for performing the foggy operation on any word line selected as the program target, and then performing the foggy operation on another word line selected as the program target before continuously performing the fine operation on the any word line is to reduce interference between word lines and improve a cell distribution.

The program operation control unit 43 may control the program and verification circuit 41 to apply a second sensing voltage to the plurality of bit lines BLs during the second verification operation included in the fine operation and apply a first sensing voltage lower than the second sensing voltage to the plurality of bit lines BLs in the first verification operation included in the foggy operation.

Typically, an application operation included in the program operation may be an operation of raising a threshold voltage of a memory cell to a target threshold voltage corresponding to a target program state of the program operation, according to data to be stored in the memory cell.

Also, typically, a verification operation included in the program operation may be an operation of verifying whether the program operation is properly performed on the memory cell. That is, the verification operation may be an operation of checking whether the threshold voltage of the memory cell on which the program operation has been performed reaches the target threshold voltage corresponding to the target program state of the program operation.

The program operation according to an embodiment may include two types of application operations. That is, the program operation according to an embodiment may include the first application operation included in the foggy operation and the second application operation included in the fine operation.

Referring to FIGS. 4 and 5, the program and verification circuit 41 may perform a first application operation FOGGY PROGRAM included in the foggy operation on the plurality of memory cells included in the word line selected as the program target, and thus raise threshold voltage Vth levels of the memory cells being in an erase state so that the memory cells may have threshold voltage Vth levels being in a foggy state.

The program and verification circuit 41 may perform a second application operation FINE PROGRAM included in the fine operation on the plurality of memory cells, which are included in the word line selected as the program target and have the threshold voltage Vth levels being in the foggy state after the foggy operation is completely performed. Accordingly, the program and verification circuit 41 may raise the threshold voltage Vth levels of the memory cells being in the foggy state so that the memory cells may have threshold voltage Vth levels being in a fine state.

The program operation according to an embodiment may include two types of verification operations. That is, the program operation according to an embodiment may include the first verification operation included in the foggy operation and the second verification operation included in the fine operation.

Referring to FIGS. 4 and 5, the program and verification circuit 41 may perform the first application operation FOGGY PROGRAM included in the foggy operation on the plurality of memory cells included in the word line selected as the program target, and then perform the first verification operation of verifying whether the first application operation FOGGY PROGRAM has been properly performed. When the first application operation FOGGY PROGRAM has been properly performed, the plurality of memory cells included in the word line selected as the program target may have the threshold voltage Vth levels being in the foggy state. Accordingly, the program operation control unit 43 may check, through the program and verification circuit 41, whether the number of memory cells each having a threshold voltage higher than a first verification voltage VFO among the plurality of memory cells included in the word line selected as the program target is equal to or greater than the first predetermined number during the first verification operation, and may verify whether the first application operation FOGGY PROGRAM has been properly performed, according to the check result. When the number of memory cells each having a threshold voltage higher than the first verification voltage VFO among the plurality of memory cells included in the word line selected as the program target is less than the first predetermined number during the first verification operation, the program operation control unit 43 may determine that the first application operation FOGGY PROGRAM has not been properly performed. When the number of memory cells each having a threshold voltage higher than the first verification voltage VFO among the plurality of memory cells included in the word line selected as the program target is equal to or greater than the first predetermined number during the first verification operation, the program operation control unit 43 may determine that the first application operation FOGGY PROGRAM has been properly performed, and thus determine that the foggy operation has been completely performed. The first predetermined number may be a natural number greater than 1. The first verification voltage VFO may have a level equal to or higher than the target threshold voltage corresponding to the target program state of the plurality of memory cells included in the word line selected as the program target.

The program and verification circuit 41 may perform the second application operation FINE PROGRAM included in the fine operation on the plurality of memory cells included in the word line selected as the program target, and then perform the second verification operation of verifying whether the second application operation FINE PROGRAM has been properly performed. When the second application operation FINE PROGRAM has been properly performed, the plurality of memory cells included in the word line selected as the program target may have the threshold voltage Vth levels being in the fine state. Accordingly, the program operation control unit 43 may check, through the program and verification circuit 41, whether the number of memory cells each having a threshold voltage higher than a second verification voltage VFI among the plurality of memory cells included in the word line selected as the program target is less than or equal to the second predetermined number during the second verification operation, and may verify whether the second application operation FINE PROGRAM has been properly performed, according to the check result. When the number of memory cells each having a threshold voltage lower than the second verification voltage VFI among the plurality of memory cells included in the word line selected as the program target is greater than the second predetermined number during the second verification operation, the program operation control unit 43 may determine that the second application operation FINE PROGRAM has not been properly performed. When the number of memory cells each having a threshold voltage lower than the second verification voltage VFI among the plurality of memory cells included in the word line selected as the program target is less than or equal to the second predetermined number during the second verification operation, the program operation control unit 43 may determine that the second application operation has been properly performed, and thus determine that the fine operation FINE PROGRAM has been completely performed, that is, the program operation has been completely performed. The second predetermined number may be a natural number greater than 1. The first predetermined number and the second predetermined number may be the same as or different from each other. That is, the first predetermined number and the second predetermined number may be each independently determined, and may not have a correlation with each other. The second verification voltage VFI may have a level equal to the target threshold voltage corresponding to the target program state of the plurality of memory cells included in the word line selected as the program target.

Typically, the application operation and the verification operation included in the program operation may be repeatedly performed through an incremental step pulse program (ISPP) method. That is, the program operation and the verification operation included in the program operation may be repeatedly performed until the plurality of memory cells included in the word line selected as the program target have the target threshold voltage corresponding to the target program state.

In the program operation according to an embodiment, the foggy operation and the fine operation may be repeatedly performed until each of the operations is completely performed. That is, the foggy operation may start at an entry time of the program operation, and be repeatedly performed until the foggy operation is completely performed during the first verification operation included in the foggy operation, and the fine operation may start in response to the foggy operation being completely performed. The fine operation may be repeatedly performed until the fine operation is completely performed during the second verification operation included in the fine operation, and the program operation may terminate in response to the fine operation being completely performed.

Referring to FIGS. 4, 5 and 6A, the program operation control unit 43 may control the program and verification circuit 41 to perform a foggy operation FOGGY on the plurality of memory cells included in the word line selected as the program target. The program operation control unit 43 may control the program and verification circuit 41 to perform a first application operation FOGGY PROGRAM and a first verification operation FOGGY VERIFY. The program operation control unit 43 may control the program and verification circuit 41 to repeatedly perform the foggy operation FOGGY until it is determined that the foggy operation FOGGY is completely performed during the first verification operation FOGGY VERIFY.

Referring to FIGS. 4, 5 and 6B, the program operation control unit 43 may control the program and verification circuit 41 to perform a fine operation FINE on the plurality of memory cells included in the word line selected as the program target after the foggy operation FOGGY is completely performed. The program operation control unit 43 may control the program and verification circuit 41 to perform a second application operation FINE PROGRAM and a second verification operation FINE VERIFY. The program operation control unit 43 may control the program and verification circuit 41 to repeatedly perform the fine operation FINE until it is determined that the fine operation FINE is completely performed during the second verification operation FINE VERIFY.

As dividedly illustrated in FIGS. 6A and 6B, the foggy operation FOGGY and the fine operation FINE on the plurality of memory cells included in the word line selected as the program target may not be continuously performed. That is, the foggy operation FOGGY may be performed on the plurality of memory cells included in the word line selected as a first application target in the manner illustrated in FIG. 6A, and the foggy operation FOGGY may be performed again on the plurality of memory cells included in the word line selected as a second application target in the manner illustrated in FIG. 6A. Subsequently, the fine operation FINE may be performed on the plurality of memory cells included in the word line selected as the first application target in the manner illustrated in FIG. 6B, and the fine operation FINE may be performed again on the plurality of memory cells included in the word line selected as the second application target in the manner illustrated in FIG. 6B.

More specifically, referring to FIGS. 4, 5 and 6A, the program operation control unit 43 may control the program and verification circuit 41 to perform a first application operation FOGGY PROGRAM and a first verification operation FOGGY VERIFY included in a first foggy operation FOGGY1 on the plurality of memory cells included in the word line selected as the program target at the entry time of the program operation.

Specifically, the program operation control unit 43 may control the program and verification circuit 41 to apply a first foggy program voltage VFPM1 to the word line selected as the program target during the first application operation FOGGY PROGRAM included in the first foggy operation FOGGY1, and raise the threshold voltage levels of the plurality of memory cells included in the word line selected as the program target. Subsequently, the program operation control unit 43 may control the program and verification circuit 41 to apply the first verification voltage VFO to the word line selected as the program target during the first verification operation FOGGY VERIFY included in the first foggy operation FOGGY1, and confirm that the number of memory cells each having a threshold voltage having a level higher than the first verification voltage VFO among the plurality of memory cells included in the word line selected as the program target is less than the first predetermined number. Accordingly, the program operation control unit 43 may control the program and verification circuit 41 to start performing a second foggy operation FOGGY2.

The program operation control unit 43 may control the program and verification circuit 41 to apply a second foggy program voltage VFPM2 to the word line selected as the program target during a first application operation FOGGY PROGRAM included in the second foggy operation FOGGY2, and raise the threshold voltage levels of the plurality of memory cells included in the word line selected as the program target. Subsequently, the program operation control unit 43 may control the program and verification circuit 41 to apply the first verification voltage VFO to the word line selected as the program target during a first verification operation FOGGY VERIFY included in the second foggy operation FOGGY2, and confirm that the number of memory cells each having a threshold voltage having a level higher than the first verification voltage VFO among the plurality of memory cells included in the word line selected as the program target is equal to or greater than the first predetermined number. Accordingly, the program operation control unit 43 may control the program and verification circuit 41 to no longer perform the foggy operation FOGGY.

For reference, the first and second foggy program voltages VFPM1 and VFPM2 used in the first application operations FOGGY PROGRAM of the first and second foggy operations FOGGY1 and FOGGY2 may have the same level as illustrated in the drawing. Differently from those illustrated in the drawing, the levels of the first and second foggy program voltages VFPM1 and VFPM2 may be different from each other.

Referring to FIGS. 4, 5 and 6B, the program operation control unit 43 may control the program and verification circuit 41 to apply a first fine program voltage VFIM1, which is generated by the voltage generator 154, to the word line selected as the program target during a second application operation FINE PROGRAM included in a first fine operation FINE1, and raise the threshold voltage levels of the plurality of memory cells included in the word line selected as the program target. Subsequently, the program operation control unit 43 may control the program and verification circuit 41 to apply the second verification voltage VFI to the word line selected as the program target during a second verification operation FINE VERIFY included in the first fine operation FINE1, and confirm that the number of memory cells each having a threshold voltage having a level lower than the second verification voltage VFI among the plurality of memory cells included in the word line selected as the program target is greater than the second predetermined number. Accordingly, the program operation control unit 43 may control the program and verification circuit 41 to start performing a second fine operation FINE2.

The program operation control unit 43 may control the program and verification circuit 41 to apply a second fine program voltage VFIM2, which is generated by the voltage generator 154, to the word line selected as the program target during a second application operation FINE PROGRAM included in the second fine operation FINE2, and raise the threshold voltage levels of the plurality of memory cells included in the word line selected as the program target. Subsequently, the program operation control unit 43 may control the program and verification circuit 41 to apply the second verification voltage VFI to the word line selected as the program target during a second verification operation FINE VERIFY included in the second fine operation FINE2, and confirm that the number of memory cells each having a threshold voltage having a level lower than the second verification voltage VFI among the plurality of memory cells included in the word line selected as the program target is greater than the second predetermined number. Accordingly, the program operation control unit 43 may control the program and verification circuit 41 to start performing a third fine operation FINE3.

The program operation control unit 43 may control the program and verification circuit 41 to apply a third fine program voltage VFIM3, which is generated by the voltage generator 154, to the word line selected as the program target during a second application operation FINE PROGRAM included in the third fine operation FINE3, and raise the threshold voltage levels of the plurality of memory cells included in the word line selected as the program target. Subsequently, the program operation control unit 43 may control the program and verification circuit 41 to apply the second verification voltage VFI to the word line selected as the program target during a second verification operation FINE VERIFY included in the third fine operation FINE3, and confirm that the number of memory cells each having a threshold voltage having a level lower than the second verification voltage VFI among the plurality of memory cells included in the word line selected as the program target is less than or equal to the second predetermined number. Accordingly, the program operation control unit 43 may control the program and verification circuit 41 to terminate the program operation without further performing the fine operation FINE. Levels of the first to third fine program voltages VFIM1, VFIM2 and VFIM3 used in the second application operations FINE PROGRAM of the first to third fine operations FINE1, FINE2 and FINE3 may increase whenever the fine operation is repeatedly performed according to the ISPP method illustrated in the drawing. For convenience in description, FIG. 6A illustrates that the program operation includes the two foggy operations FOGGY1 and FOGGY2, and FIG. 6B illustrates that the program operation includes the three fine operations FINE1, FINE2 and FINE3, but these are merely embodiments, and an actual operation may be implemented differently.

Typically, when a verification operation included in the program operation is performed, a power source voltage or a ground voltage may be applied to each of a plurality of bit lines intersecting a word line selected as a program target. For example, when the verification operation included in the program operation is performed, the power source voltage may be applied to a bit line selected as a verification target among the plurality of bit lines, but the ground voltage may be applied to unselected bit lines.

In the program operation according to an embodiment, a level of a voltage applied to a bit line selected as a verification target in a first verification operation included in a foggy operation may be set differently from a level of a voltage applied to a bit line selected as a verification target in a second verification operation included in a fine operation. Specifically, the level of the voltage applied to the bit line selected as the verification target in the second verification operation included in the fine operation may be set to be higher than the level of the voltage applied to the bit line selected as the verification target in the first verification operation included in the foggy operation. For example, the power source voltage may be applied to the bit line selected as the verification target in the second verification operation included in the fine operation, and a voltage lower than the power source voltage may be applied to the bit line selected as the verification target in the first verification operation included in the foggy operation.

FIG. 7 is a diagram illustrating an example of a program operation including a foggy operation and a fine operation, in accordance with an embodiment of the present disclosure.

Figure 8:
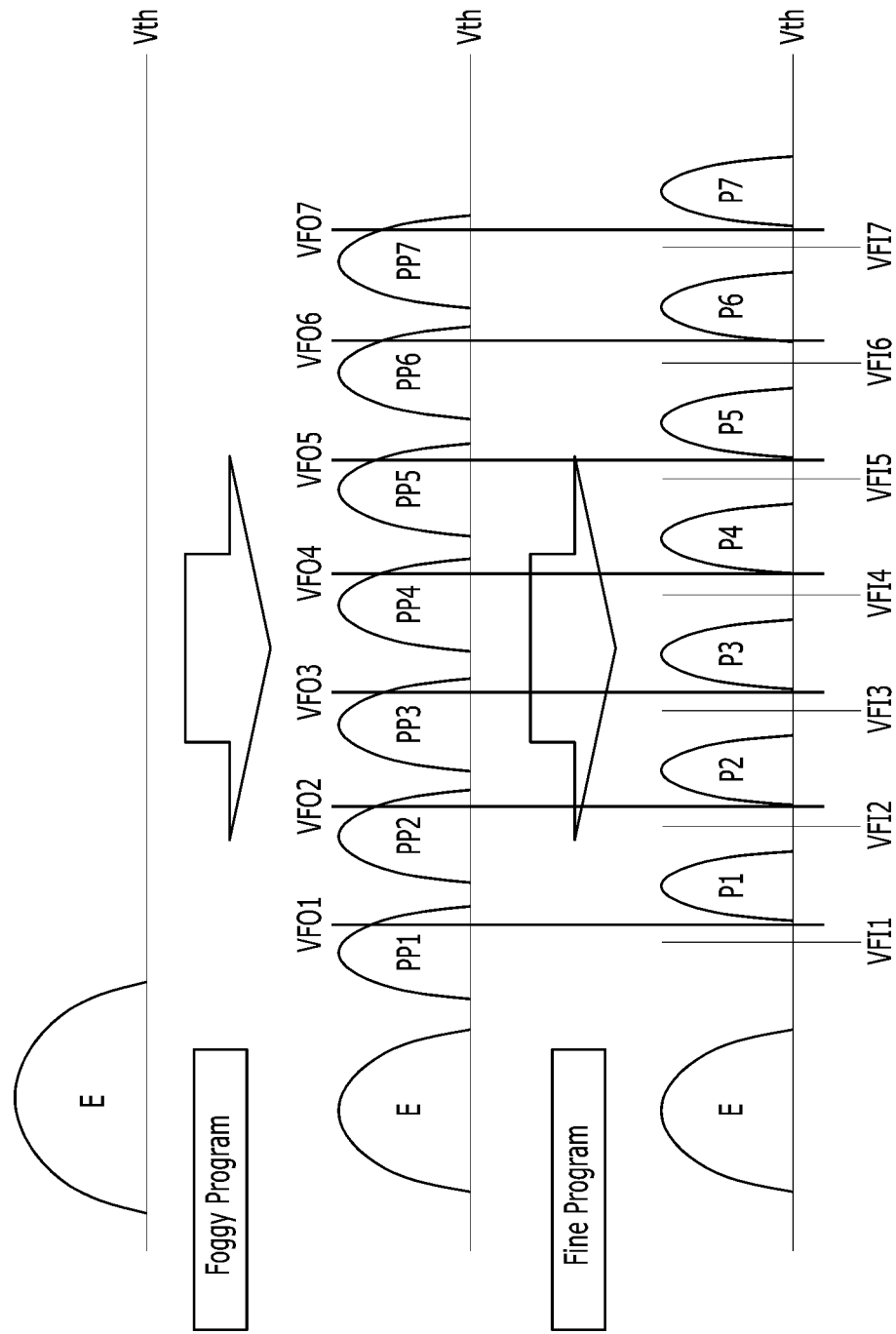
FIG. 8 is a diagram illustrating another example of the program operation including a foggy operation and a fine operation, in accordance with an embodiment of the present disclosure.

FIG. 8 is a diagram illustrating another example of a program operation including a foggy operation and a fine operation, in accordance with an embodiment of the present disclosure.

Referring to FIGS. 4 to 8, when the first application operation FOGGY PROGRAM included in the foggy operation FOGGY and the second application operation FINE PROGRAM included in the fine operation FINE are performed on the plurality of memory cells included in one word line selected as the program target, it may be seen how a threshold voltage distribution changes.

In FIGS. 7 and 8, each of the plurality of memory cells is a triple-level cell (TLC) capable of storing 3-bit data. Accordingly, when the program operation is completely performed on the plurality of memory cells included in the word line selected as the program target, that is, the first application operation FOGGY PROGRAM and the first verification operation FOGGY VERIFY included in the FOGGY operation and the second application operation FINE PROGRAM and the second verification operation FINE VERIFY included in the fine operation FINE are all completely performed, the plurality of memory cells may have a total of eight types of program states E, P1, P2, P3, P4, P5, P6 and P7.

Referring to FIGS. 4 to 7, when the plurality of memory cells included in the word line selected as the program target are all in an erase state E, the program operation may start, and the first application operation FOGGY PROGRAM and the first verification operation FOGGY VERIFY included in the foggy operation FOGGY may be performed at least once. In this case, three first verification voltages VFO1, VFO2 and VFO3 may be used in the first verification operation FOGGY VERIFY so that it is determined whether the foggy operation FOGGY has been completely performed. Accordingly, when the foggy operation FOGGY is completely performed, the plurality of memory cells may have a total of four types of program states E, PP1, PP2 and PP3.

In this way, after the plurality of memory cells included in the word line selected as the program target have the four types of program states E, PP1, PP2 and PP3 through the foggy operation FOGGY, the second application operation FINE PROGRAM and the second verification operation FINE VERIFY included in the fine operation FINE may be performed at least once. In this case, seven second verification voltages VFI1, VFI2, VFI3, VFI4, VFI5, VFI6 and VFI7 may be used in the second verification operation FINE VERIFY so that it is determined whether the fine operation FINE has been completely performed.

As described above, in FIG. 7, the number of the first verification voltages VFO1, VFO2 and VFO3 used in the first verification operation FOGGY VERIFY included in the foggy operation FOGGY may be set differently from the number of the second verification voltages VFI1, VFI2, VFI3, VFI4, VFI5, VFI6 and VFI7 used in the second verification operation FINE VERIFY included in the fine operation FINE. Herein, the seven second verification voltages VFI1, VFI2, VFI3, VFI4, VFI5, VFI6 and VFI7 may have the same level as seven target threshold voltages for classifying the eight types of program states E, P1, P2, P3, P4, P5, P6 and P7. The three first verification voltages VFO1, VFO2 and VFO3 may have the same level as or higher levels than three of the seven target threshold voltages for classifying the eight types of program states E, P1, P2, P3, P4, P5, P6 and P7. In FIG. 7, it may be seen that the first verification voltage VFO1 has a higher level than a second target threshold voltage, the second first verification voltage VFO2 has a higher level than a fourth target threshold voltage, and the third first verification voltage VFO3 has a higher level than a sixth target threshold voltage.

Referring to FIGS. 4 to 6B and 8, when the plurality of memory cells included in the word line selected as the program target are all in an erase state E, the program operation may start, and the first application operation FOGGY PROGRAM and the first verification operation FOGGY VERIFY included in the foggy operation FOGGY may be performed at least once. In this case, seven first verification voltages VFO1, VFO2, VFO3, VFO4, VFO5, VFO6 and VFO7 may be used in the first verification operation FOGGY VERIFY so that it is determined whether the foggy operation FOGGY has been completely performed. Accordingly, in a state in which the foggy operation FOGGY is completely performed, the plurality of memory cells may have a total of eight types of program states E, PP1, PP2, PP3, PP4, PP5, PP6 and PP7.

In this way, after the plurality of memory cells included in the word line selected as the program target have the eight types of program states E, PP1, PP2, PP3, PP4, PP5, PP6 and PP7 through the foggy operation FOGGY, the second application operation FINE PROGRAM and the second verification operation FINE VERIFY included in the fine operation FINE may be performed at least once. In this case, seven second verification voltages VFI1, VFI2, VFI3, VFI4, VFI5, VFI6 and VFI7 may be used in the second verification operation FINE VERIFY so that it is determined whether the fine operation FINE has been completely performed.

As described above, in FIG. 8, the number of the first verification voltages VFO1, VFO2, VFO3, VFO4, VFO5, VFO6 and VFO7 used in the first verification operation FOGGY VERIFY included in the foggy operation FOGGY may be set to be the same as the number of the second verification voltages VFI1, VFI2, VFI3, VFI4, VFI5, VFI6 and VFI7 used in the second verification operation FINE VERIFY included in the fine operation FINE. Herein, the seven second verification voltages VFI1, VFI2, VFI3, VFI4, VFI5, VFI6 and VFI7 may have the same level as seven target threshold voltages for classifying the eight types of program states E, P1, P2, P3, P4, P5, P6 and P7. The seven first verification voltages VFO1, VFO2, VFO3, VFO4, VFO5, VFO6 and VFO7 may have the same level as or higher levels than the seven target threshold voltages for classifying the eight types of program states E, P1, P2, P3, P4, P5, P6 and P7.

Figure 9:
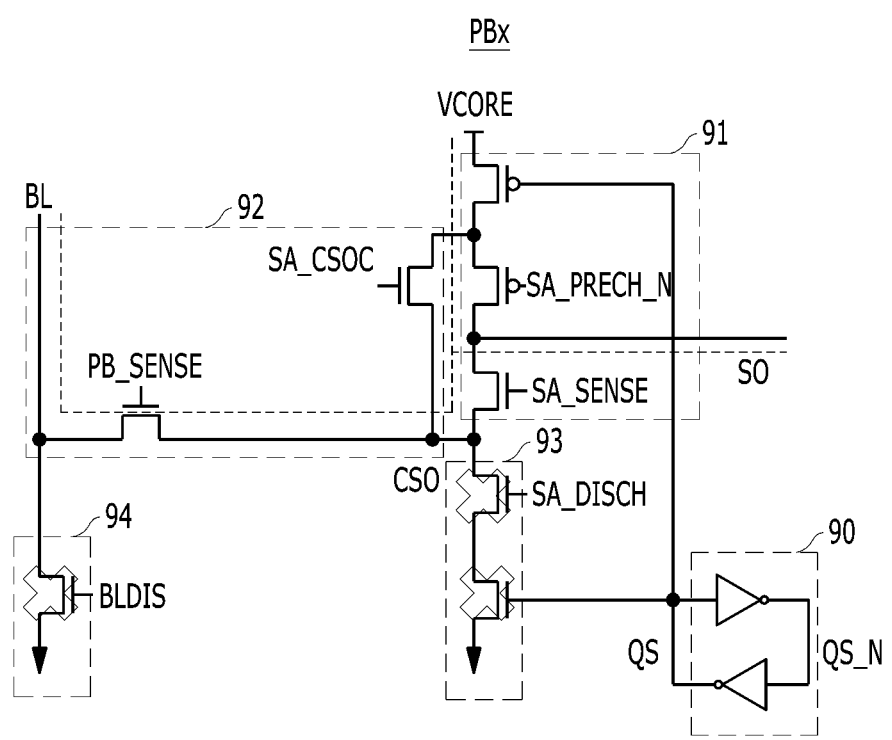
FIG. 9 is a detailed diagram illustrating a page buffer illustrated in FIG. 2 according to a program operation in accordance with an embodiment of the present disclosure.

FIG. 9 is a detailed diagram illustrating the page buffer illustrated in FIG. 2 according to a program operation in accordance with an embodiment of the present disclosure.

Figure 10:
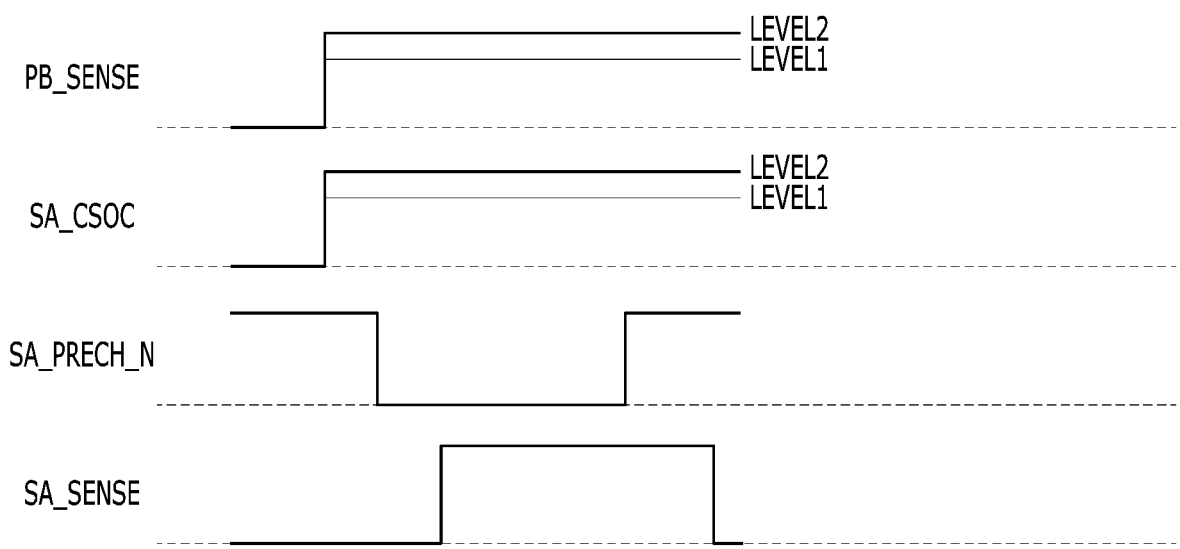
FIG. 10 is a diagram illustrating an operation of the page buffer illustrated in FIG. 9 in accordance with an embodiment of the present disclosure.

FIG. 10 is a diagram illustrating an operation of the page buffer illustrated in FIG. 9 in accordance with an embodiment of the present disclosure.

Referring to FIG. 9, it may be seen that a detailed configuration of each PBx of the plurality of page buffers PB1 to PBm included in the page buffer group 156 illustrated in FIG. 2 is disclosed. As described with reference to FIG. 2, the plurality of memory cells may be connected to the plurality of page buffers PB1 to PBm, which are included in the page buffer group 156 included in the peripheral circuit 152, through the plurality of bit lines BL1 to BLm, respectively.

Specifically, each PBx of the plurality of page buffers PB1 to PBm according to an embodiment may be connected between any bit line BL of the plurality of bit lines BL1 to BLm and a sensing node SO. Each PBx of the plurality of page buffers PB1 to PBm may include a latch 90, a first connection control unit 91, a second connection control unit 92, a third connection control unit 93 and a fourth connection control unit 94.

A logic level stored in the latch 90 may be determined according to whether verification of each of the plurality of bit lines BL1 to BLm is allowed. According to an embodiment, since FIG. 9 illustrates only a node QS of the latch 90, and describes a case in which the verification is allowed, the node QS of the latch 90 has a level of a ground voltage VSS. When the verification is not allowed, the node QS of the latch 90 may have a level of a power source voltage VCORE.

The first connection control unit 91 may electrically connect sensing nodes SO and CSO to a power source voltage VCORE terminal in response to the logic level stored in the latch 90 and first control signals SA_PRECH_N and SA_SENSE.

The second connection control unit 92 may electrically connect the bit line BL to the sensing nodes SO and CSO in response to second control signals PB_SENSE and SA_CSOC.

The third connection control unit 93 may electrically connect the sensing nodes SO and CSO to a ground voltage VSS terminal in response to the logic level stored in the latch 90 and a third control signal SA_DISCH.

The fourth connection control unit 94 may electrically connect the bit line BL to the ground voltage VSS terminal in response to a fourth control signal BLDIS.

The program operation control unit 43 may generate the first control signals SA_PRECH_N and SA_SENSE, the second control signals PB_SENSE and SA_CSOC, the third control signal SA_DISCH and the fourth control signal BLDIS, and transmit the generated signals to the program and verification circuit 41.

Referring to FIGS. 2 to 5, 9 and 10, the program operation control unit 43 may control the program and verification circuit 41 to properly adjust activation times and levels of the first control signals SA_PRECH_N and SA_SENSE, the second control signals PB_SENSE and SA_CSOC, the third control signal SA_DISCH and the fourth control signal BLDIS and set a level of a voltage, applied to the bit line BL selected as a verification target during the first verification operation FOGGY VERIFY included in the foggy operation FOGGY, to be different from a level of a voltage applied to the bit line BL selected as a verification target during the second verification operation FINE VERIFY included in the fine operation FINE. That is, the program operation control unit 43 may properly adjust the activation times and levels of the first control signals SA_PRECH_N and SA_SENSE, the second control signals PB_SENSE and SA_CSOC, the third control signal SA_DISCH and the fourth control signal BLDIS, and set the level of the voltage, applied to the bit line BL selected as the verification target during the first verification operation FOGGY VERIFY included in the foggy operation FOGGY, to be lower than the level of the voltage applied to the bit line BL selected as the verification target during the second verification operation FINE VERIFY included in the fine operation FINE.

Specifically, the program operation control unit 43 may activate the first control signals SA_PRECH_N and SA_SENSE at a logic high level and electrically connect the sensing nodes SO and CSO to the power source voltage VCORE terminal through the first connection control unit 91, during each of the first verification operation FOGGY VERIFY included in the foggy operation FOGGY and the second verification operation FINE VERIFY included in the fine operation FINE, thereby applying the power source voltage VCORE to the sensing nodes SO and CSO. The program operation control unit 43 may deactivate the third control signal SA_DISCH at a logic low level and not electrically connect the sensing nodes SO and CSO to the ground voltage VSS terminal through the third connection control unit 93, during each of the first verification operation FOGGY VERIFY included in the foggy operation FOGGY and the second verification operation FINE VERIFY included in the fine operation FINE. The program operation control unit 43 may deactivate the fourth control signal BLDIS at a logic low level and not electrically connect the bit line BL to the ground voltage VSS terminal through the fourth connection control unit 94, during each of the first verification operation FOGGY VERIFY included in the foggy operation FOGGY and the second verification operation FINE VERIFY included in the fine operation FINE. The program operation control unit 43 may activate the second control signals PB_SENSE and SA_CSOC at a first potential level LEVEL1 and electrically connect the sensing nodes SO and CSO to the bit line BL through the second connection control unit 92, during the first verification operation FOGGY VERIFY included in the foggy operation FOGGY, thereby controlling the program and verification circuit 41 to apply the first sensing voltage to the bit line BL. The program operation control unit 43 may activate the second control signals PB_SENSE and SA_CSOC at a second potential level LEVEL2 higher than the first potential level LEVEL1 and electrically connect the sensing nodes SO and CSO to the bit line BL through the second connection control unit 92, during the second verification operation FINE VERIFY included in the fine operation FINE, thereby controlling the program and verification circuit 41 to apply the second sensing voltage having a higher potential level than the first sensing voltage to the bit line BL.

According to embodiments of the present disclosure, data may be stored in a non-volatile memory device through a program operation including two different types of application operations and two different types of verification operations. Accordingly, a cell distribution may be effectively improved even in a state in which the amount of current consumed in the program operation is minimized.

The effects obtainable from the present disclosure are not limited to those described herein. Other effects not described herein will be apparently understood by those skilled in the art, to which the present disclosure pertains, from the above detailed description.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims.

For example, dispositions and types of the logic gates and transistors described in the aforementioned embodiments may be implemented differently depending on the polarity of an inputted signal. Furthermore, the embodiments may be combined to form additional embodiments.

What is claimed is:

1. A non-volatile memory device comprising:
a memory cell array including a plurality of memory cells coupled between a plurality of word lines and a plurality of bit lines;
a peripheral circuit suitable for:
performing a foggy operation including a first application operation of applying a first application voltage to a selected word line among the plurality of word lines and a first verification operation of applying a first verification voltage having a same level as or a higher level than a target threshold voltage to the selected word line, and
performing a fine operation including a second application operation of applying a second application voltage to the selected word line and a second verification operation of applying a second verification voltage having the same level as the target threshold voltage; and
a control logic circuit suitable for:
determining whether the foggy operation is completely performed according to whether a number of memory cells each having a threshold voltage higher than the first verification voltage is equal to or greater than a first predetermined number as a result of the first verification operation, and
determining whether the fine operation is completely performed according to whether a number of memory cells each having a threshold voltage lower than the second verification voltage is less than or equal to a second predetermined number as a result of the second verification operation.

2. The non-volatile memory device of claim 1,
wherein the peripheral circuit repeatedly performs the foggy operation until the foggy operation is determined as completely performed, and
wherein the peripheral circuit repeatedly performs the fine operation, after the foggy operation is determined as completely performed, until the fine operation is determined as completely performed.

3. The non-volatile memory device of claim 2,
wherein the peripheral circuit repeatedly performs the foggy operation when the number of memory cells each having the threshold voltage higher than the first verification voltage is less than the first predetermined number, and
wherein the peripheral circuit performs the fine operation when the number of memory cells each having the threshold voltage higher than the first verification voltage is equal to or greater than the first predetermined number.

4. The non-volatile memory device of claim 3,
wherein the peripheral circuit repeatedly performs the fine operation when the number of memory cells each having the threshold voltage lower than the second verification voltage is greater than the second predetermined number, and
wherein the peripheral circuit ends the fine operation when the number of memory cells each having the threshold voltage lower than the second verification voltage is less than or equal to the second predetermined number.

5. The non-volatile memory device of claim 1, wherein the peripheral circuit is further suitable for:
applying a first sensing voltage to a bit line during the first verification operation, and
applying a second sensing voltage higher than the first sensing voltage to the bit line during the second verification operation.

6. The non-volatile memory device of claim 5, wherein the peripheral circuit includes a plurality of page buffers connected to the plurality of memory cells through the plurality of bit lines, respectively, and each including:
a latch having a logic level stored therein and determined according to whether the program operation on each of the bit lines is allowed;
a first connection control unit suitable for electrically connecting a sensing node to a power source voltage terminal in response to the logic level stored in the latch and a first control signal; and
a second connection control unit suitable for electrically connecting each of the bit lines to the sensing node in response to a second control signal.

7. The non-volatile memory device of claim 6, wherein each of the plurality of page buffers is suitable for:
applying a power source voltage to the sensing node by activating the first control signal and electrically connecting the sensing node to the power source voltage terminal through the first connection control unit, during each of the first verification operation and the second verification operation,
applying the first sensing voltage to the bit line by activating the second control signal at a first potential level and electrically connecting the sensing node to the bit line through the second connection control unit, during the first verification operation, and
applying the second sensing voltage to the bit line by activating the second control signal at a second potential level higher than the first potential level and electrically connecting the sensing node to the bit line through the second connection control unit, during the second verification operation.

8. An operating method of a non-volatile memory device, the operating method comprising:
performing a foggy operation including a first application operation of applying a first application voltage to a selected word line among a plurality of word lines and a first verification operation of applying a first verification voltage having a same level as or a higher level than a target threshold voltage to the selected word line;
performing a first determination of determining whether the foggy operation is completely performed according to whether a number of memory cells each having a threshold voltage higher than the first verification voltage is equal to or greater than a first predetermined number as a result of the first verification operation;
performing a fine operation including a second application operation of applying a second application voltage to the selected word line and a second verification operation of applying a second verification voltage having the same level as the target threshold voltage; and
performing a second determination of determining whether the fine operation is completely performed, according to whether a number of memory cells each having a threshold voltage lower than the second verification voltage is less than or equal to a second predetermined number as a result of the second verification operation.

9. The operating method of claim 8,
wherein the performing of the foggy operation is repeated until the foggy operation is determined as completely performed; and
wherein the performing of the fine operation is repeated, after the foggy operation is determined as completely performed, until the fine operation is determined as completely performed.

10. The operating method of claim 9, wherein the performing of the first determination includes:
determining that the foggy operation is not completely performed when the number of memory cells each having the threshold voltage higher than the first verification voltage is less than the first predetermined number; and
determining that the foggy operation is completely performed when the number of memory cells each having the threshold voltage higher than the first verification voltage is equal to or greater than the first predetermined number.

11. The operating method of claim 10, wherein the performing of the second determination includes:
determining that the fine operation is not completely performed when the number of memory cells each having the threshold voltage lower than the second verification voltage is greater than the second predetermined number; and
determining that the fine operation is completely performed when the number of memory cells each having the threshold voltage lower than the second verification voltage is less than or equal to the second predetermined number.

12. The operating method of claim 8, further comprising:
applying a first sensing voltage to a bit line during the first verification operation; and
applying a second sensing voltage higher than the first sensing voltage to the bit line during the second verification operation.

13. An operating method of a nonvolatile memory device including a row of cells, the operating method comprising:
performing a foggy program operation to the row;
performing a foggy verification operation of verifying the foggy program operation by applying a foggy verification voltage, which is equal to or higher than a target threshold voltage, to the row and a foggy sensing voltage to columns of the respective cells;
performing a fine program operation to the row when the foggy program operation is verified as successful; and
performing a fine verification operation of verifying the fine program operation by applying a fine verification voltage, which is equal to the target threshold voltage, to the row and a fine sensing voltage, which is higher than the foggy sensing voltage, to the columns,
wherein the foggy program operation is verified as successful when a number of the cells each having a threshold voltage higher than the foggy verification voltage is greater than a first threshold, and
wherein the fine program operation is verified as successful when a number of the cells each having a threshold voltage lower than the foggy verification voltage is less than a second threshold.

* * * * *